United States Patent [19]
Stolmeijer

[11] Patent Number: 5,834,845
[45] Date of Patent: Nov. 10, 1998

[54] INTERCONNECT SCHEME FOR INTEGRATED CIRCUITS

[75] Inventor: Andre Stolmeijer, Santa Clara, Calif.

[73] Assignee: Advanced Micro Devices, Inc., Sunnyvale, Calif.

[21] Appl. No.: 532,915

[22] Filed: Sep. 21, 1995

[51] Int. Cl.⁶ .................................................. H01L 23/52
[52] U.S. Cl. ......................... 257/752; 257/758; 257/760; 257/763
[58] Field of Search ........................... 257/752, 758–760, 257/751, 763, 764, 765

[56] References Cited

U.S. PATENT DOCUMENTS

| | | | |
|---|---|---|---|
| 3,838,442 | 9/1974 | Humphreys | 257/752 |
| 4,576,900 | 3/1986 | Chiang | 257/758 |
| 4,789,648 | 12/1988 | Chow et al. | 437/225 |
| 4,816,895 | 3/1989 | Kikkawa | 257/758 |
| 4,962,058 | 10/1990 | Cronin et al. | 257/752 |
| 5,060,045 | 10/1991 | Owada et al. | 257/211 |
| 5,063,175 | 11/1991 | Broadbent | 257/774 |
| 5,069,749 | 12/1991 | Gutierrez | 156/646 |
| 5,084,414 | 1/1992 | Manley et al. | 437/189 |
| 5,091,339 | 2/1992 | Carey | 437/187 |
| 5,451,804 | 9/1995 | Lur et al. | 257/752 |
| 5,539,255 | 7/1996 | Cronin | 257/752 |

FOREIGN PATENT DOCUMENTS

| | | | |
|---|---|---|---|
| 0 175 604 | 8/1985 | European Pat. Off. | H01L 21/90 |
| 0 537 749 | 10/1992 | European Pat. Off. | H01L 21/90 |
| 0102763 | 6/1985 | Japan | 257/758 |
| 2 268 329 | 1/1993 | United Kingdom | H01L 23/528 |

OTHER PUBLICATIONS

"Process and Structure for Improved Electromigration Resistance", IBM Technical Disclosure Bulletin, vol. 32, No. 10B, Mar. 1990, p. 112.

*Primary Examiner*—Peter Toby Brown
*Attorney, Agent, or Firm*—Sawyer & Associates

[57] ABSTRACT

A novel interconnect layout method and metallization scheme is provided that simplifies the process of fabricating multilayer interconnects. The process of the present invention provides a multilevel interconnect structure formed solely from patterned metal layers stacked on top of each other. Both interconnect lines which form electrical connections along horizontal paths, as well as contacts which form electrical connections along vertical paths, can be formed using patterned metal interconnects as building-blocks. No specific process module is needed for contact layers. The use of patterned metal layers formed from the same process modules makes both design and construction of multilayer interconnects simpler. Accordingly, the manufacturing process is simplified, thus resulting in lower cost. To form thicker metal layers for the purpose of constructing thick interconnect lines, two or more patterned metal layers may be stacked on each other. In this manner, vertical low ohmic bussing is made possible.

33 Claims, 3 Drawing Sheets

INTERCONNECT SCHEME FOR INTEGRATED CIRCUITS

TECHNICAL FIELD

The present invention relates generally to multilevel interconnects employed in semiconductor technology, and, more particularly, to simplifying the fabrication of multilayer interconnects for sub-half micrometer semiconductor devices.

BACKGROUND ART

To accommodate higher packing density in present integrated circuits, metal connection to integrated circuit devices formed in a semiconductor substrate are made by multilayer interconnects. Each level of multilayer interconnects is supported over the semiconductor substrate by an interlevel dielectric. To make electrical connection between different levels, contacts in the form of metal plugs are interposed between these different levels.

For sub-micrometer devices tungsten plugs have been widely used in industry as contacts to form interconnection between different levels. Typically, the tungsten plugs are formed in the interlevel dielectric by employing a damascene metallization process. By "damascene" is meant a process in which trenches or contact/via openings are formed and then filled with metal using CVD (chemical vapor deposition), PVD (physical vapor deposition), or other techniques, followed by a polish or etchback to remove any overfilled areas. The term is based on a process developed by goldsmiths in ancient Damascus, comprising crafting a pattern or design on a hard surface and then hammering fine gold wires onto the designed pattern.

The formation of a tungsten plug is accomplished by first depositing an oxide which forms the interlevel dielectric. The oxide is sequentially patterned and etched to form contact/via openings in the interlevel dielectric. These contact/via openings are filled by blanket tungsten deposition. (Prior to blanket tungsten deposition, a barrier layer comprising TiN or a Ti/TiN stack may be deposited on the interlevel dielectric.) The metal on top of the interlevel dielectric is removed by plasma etchback or chemical mechanical polish (CMP), thus forming the metal plug. In this manner, contact may be formed with previously-doped regions in the semiconductor substrate, polysilicon, or other metal layers.

As such, the multilayer interconnect structure comprises multiple levels of patterned metal lines or interconnects with connection between the different levels of interconnects being formed with contacts, i.e., metal plugs. In contemporary technology, the contacts are fabricated using tungsten and the interconnect lines are fabricated using aluminum. The use of tungsten for the contact (or metal plug) necessitates an intricate manufacturing process; one process is utilized for the tungsten deposition and subsequent etch and one process is utilized for the aluminum deposition and subsequent etch.

What is needed is a simplified processing sequence in which no specific process module is needed for contact layers.

DISCLOSURE OF INVENTION

In accordance with the invention, a novel interconnect layout method and metallization scheme is provided that simplifies the process of fabricating multilayer interconnects structures.

The process for forming multilayer interconnects for connecting conductive regions separated by insulating regions supported on a semiconductor substrate comprises:

(a) forming a planar structure over the semiconductor substrate, the planar structure having a top surface and comprising a patterned metal layer embedded in a dielectric, thereby forming metal regions and dielectric regions, the patterned metal layer comprising either a single conductor layer or the single conductor layer and a substantially thinner barrier layer;

(b) planarizing the top surface by etching or polishing, thereby exposing the patterned metal layer and the dielectric at the top surface of the planar structure; and (c) repeating steps (a) and (b) at least once, thereby forming a plurality of planar structures stacked one on top of another over the semiconductor substrate. Each planar structure has the top surface and a bottom surface and has at least one adjacent planar structure contacting the top surface, the bottom surface, or both. The process thereby enables electrical contact to be formed between selected metal regions in the adjacent planar structures so as to form patterned metal interconnects which form electrical connection along paths perpendicular to the substrate and electrical connection on paths parallel to the substrate.

The process of the present invention provides a multilevel interconnect structure formed solely from patterned metal layers stacked on top of each other. Both interconnect lines which form electrical connections along horizontal paths, as well as contacts which form electrical connections along vertical paths, can be formed using patterned metal interconnects as building-blocks. No specific process module is needed for contact layers. The use of patterned metal layers formed from the same process modules makes both design and construction of multilayer interconnects simpler. Accordingly, the manufacturing process is simplified, thus resulting in lower cost. To form thicker metal layers for the purpose of constructing thick interconnect lines, two or more patterned metal layers may be stacked on each other. In this manner, vertical low ohmic bussing is made possible.

Other objects, features, and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventor for practicing the invention. Alternative embodiments are also briefly described as applicable.

Figure 1:
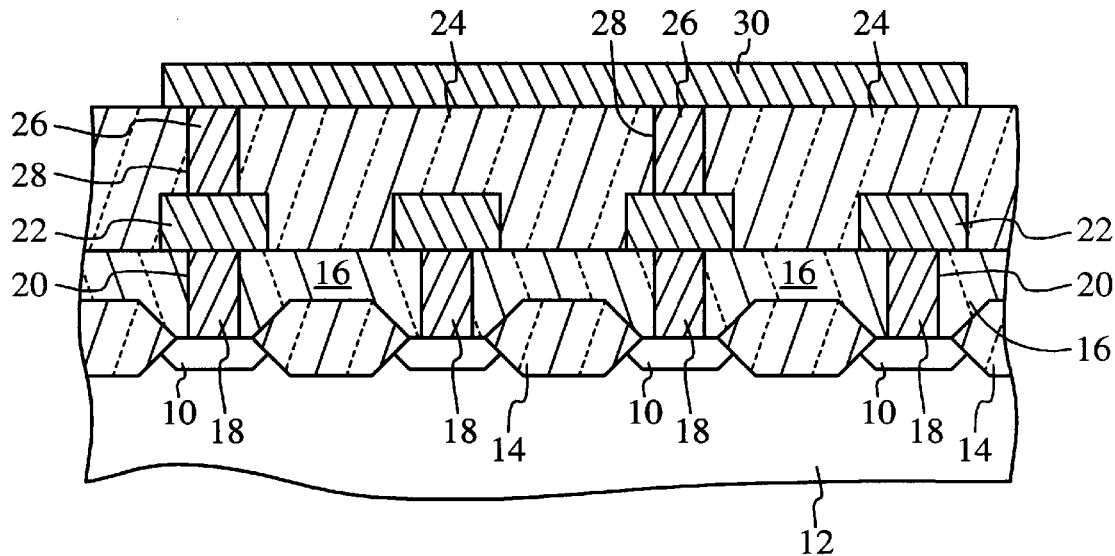
FIG. 1 is a cross-sectional view depicting a multilayer interconnect structure employed in the prior art.

FIG. 1 provides a cross-sectional view of the present prior art approach to contact/interconnect metallization, employing two layers. This approach has been disclosed and claimed in a series of U.S. patents issued to Jacob D. Haskell and assigned to the same assignee as the present invention. The patents include U.S. Pat. Nos. 4,974,055; 4,977,108; 5,028,555; 5,055,427; 5,057,902; and 5,081,516.

Essentially, a plurality of conductive regions or doped regions 10 are formed in a semiconductor substrate 12, such as silicon. A field oxide (i.e., an insulating region) 14 separates the doped regions 10 from each other. A first planarized interlevel dielectric 16 surrounds first metal plugs 18 comprising tungsten, which contact the doped regions 10. The first metal plugs 18 are formed in first contact/via openings 20 in the first interlevel dielectric 16. First metal interconnects 22 electrically contact the first metal plugs 18 in a predetermined pattern.

A second planarized interlevel dielectric layer 24 surrounds the first metal interconnects 22. The second planarized interlevel dielectric 24 also surrounds second metal plugs 26, also comprising tungsten. The second metal plugs 26 are formed in second contact/via openings 28 in the second interlevel dielectric 24. On top of the second interlevel dielectric layer 24 are formed second metal interconnects 30. The second metal plugs 26 form electrical connection between the first metal interconnects 22 and the second metal interconnects 30. The first metal plugs 18 and the second metal plugs 26, in this case, comprise tungsten; however, the metal plugs may comprise other metals such as aluminum. As described above, a barrier layer comprising Ti or a Ti/TiN stack (not shown) may be formed in the first contact/via openings 20 or the second contact/via openings 28 prior to the formation of the first metal plugs 18 and the second metal plugs 26, respectively.

Figure 2:
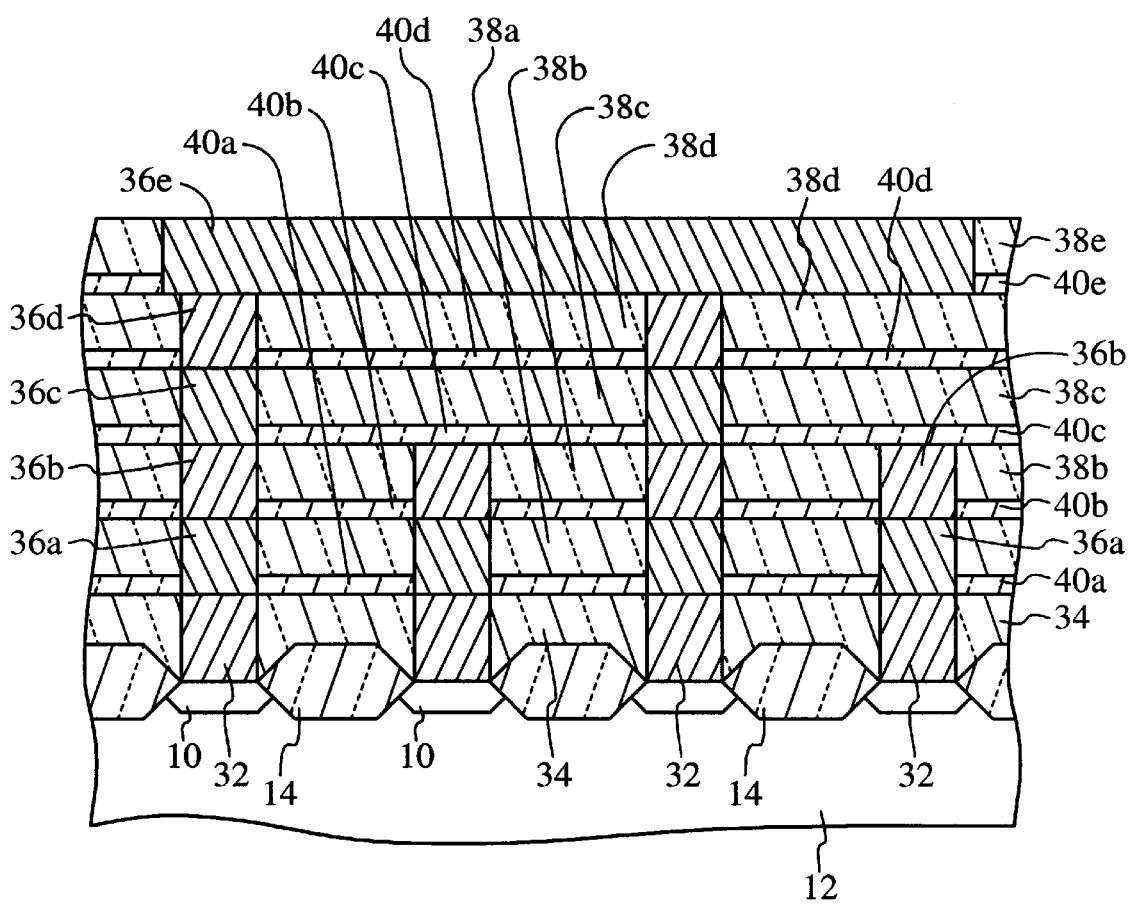
FIG. 2 is a cross-sectional view depicting a multilayer interconnect structure formed by the process of the present invention which is functionally analogous to the multilayer interconnect structure shown in FIG. 1.

FIG. 2 depicts a functionally analogous structure to that shown in FIG. 1, however, the multilayer interconnect structure shown in FIG. 2 is formed with the novel interconnect layout method and metallization scheme of the present invention.

As described above, the prior art multilayer interconnect structure shown in FIG. 1 comprises multiple levels of patterned metal lines (the first metal interconnects 22 and the second metal interconnects 30) with connection between the different levels being formed with contacts or metal plugs (the first metal plugs 18 and the second metal plugs 26).

In contrast, the process of the present invention provides a multilevel interconnect structure formed solely from patterned metal layers stacked on top of each other. The patterned metal layers serve as both the patterned metal lines and building-blocks for forming contacts.

As such, the first metal plugs 18 and the second metal plugs 26 comprising tungsten, which are shown in FIG. 1, are in effect replaced by stacks of patterned metal layers. The patterned metal lines, similar to the first metal interconnects 22 and the second metal interconnects 30 shown in FIG. 1, are also formed from pattern metal layers.

FIG. 2 shows an initial patterned metal layer or first patterned metal layer 32 formed on the plurality of doped regions 10 in the semiconductor substrate 12 which reside between the field oxide 14. The first patterned metal layer 32 is surrounded by a first silicon oxide layer (i.e., an initial layer of dielectric) 34. The first silicon oxide layer 34 may be formed on a first silicon nitride etch stop layer (not shown). In theory, an etch stop layer is not required, however, in practice an etch stop layer is needed.

Patterned metal layers, i.e., additional patterned metal layers 36 are formed on the first patterned metal layer 32. The additional patterned metal layers 36 are likewise surrounded by additional silicon oxide layers (i.e., a layer of dielectric) 38 formed on silicon nitride etch stop layers (i.e., an etch stop) 40. The first patterned metal layer 32 comprises tungsten, while the additional patterned metal layers 36 comprise aluminum.

Accordingly, in the multilayer interconnect structure shown in FIG. 2, the first metal plugs 18 which are shown in FIG. 1, are in effect replaced by the first patterned metal layer 32 and additional patterned metal layer 36a. The second metal plugs 26 shown in FIG. 1, are in effect replaced by additional patterned metal layer 36c and additional patterned metal layer 36d. The first metal interconnects 22 and the second metal interconnects 30 shown in FIG. 1 are in effect replaced by additional patterned metal layer 36b and additional patterned metal layer 36e.

To achieve the same functionality as the multilayer interconnect structure shown in FIG. 1 using the process of the invention, the required number of layers is at least four (two contact/via layers and two interconnect layers), in which case, each contact/via layer is changed into one patterned metal layer and each interconnect layer is changed into one patterned metal layer. In the multilayer interconnect structure of the present invention shown in FIG. 2, each contact/via layer is changed into two patterned metal layers and each interconnect layer is changed into one patterned metal layer, thus six layers are employed.

Figure 3:
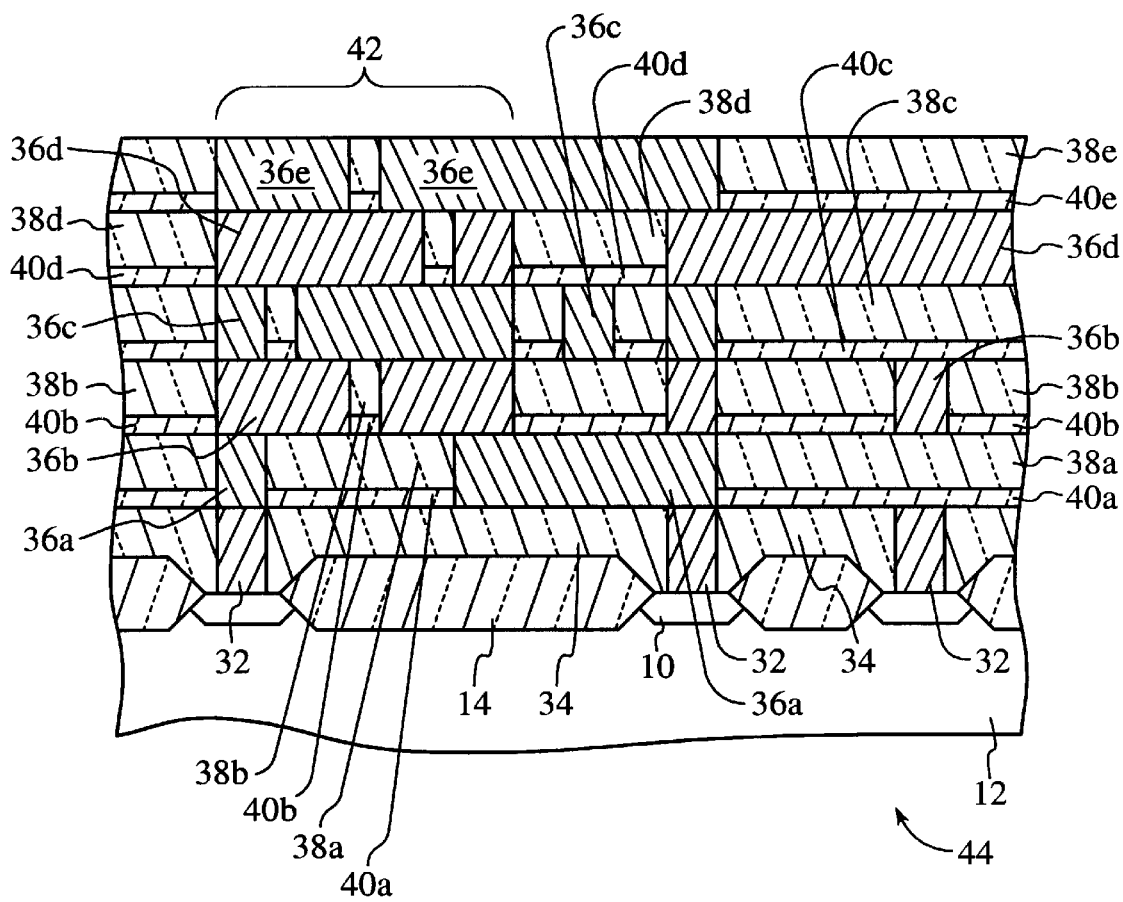
FIG. 3 is a cross-sectional view depicting an additional multilayer interconnect structure formed by the process of the present invention.

Refer now to FIG. 3 where a second multilayer interconnect structure formed by the process of the present invention is shown. A six-layer metal interconnect structure is presented as an illustration of the method of the present invention. However, it will be readily appreciated that the method of the invention is applicable to any number of metal layers as required in the device.

One embodiment of the process of the invention now follows:

Semiconductor wafers, comprising the semiconductor substrate 12 and devices (not shown) formed therein are processed by conventional process technology, including the formation of doped regions 10 which are employed in integrated circuit devices. Such processing is conventional and forms no part of this invention.

FIG. 3 shows a region of the semiconductor substrate 12 where doped regions 10 have been formed and reside between the field oxide 14. While only a portion of the semiconductor substrate 12 with three doped regions 10 is shown, it will be readily apparent to those skilled in this art that in fact a plurality of such doped regions are formed to which electrical connection is made.

In accordance with the invention, a first patterned metal layer 32 is formed on the doped regions 10. In the preferred embodiment of the present invention, the patterned metal layers are formed by employing a damascene metallization process as damascene metallization is the easiest to implement. Accordingly, a first silicon oxide layer 34 is deposited. The first silicon oxide layer 34 may be formed on a first silicon nitride etch stop layer (not shown). As discussed above, an etch top layer is not required in theory, however, in practice, an etch stop layer is needed. A predetermined pattern is etched into the first silicon oxide layer 34.

Figure 4:
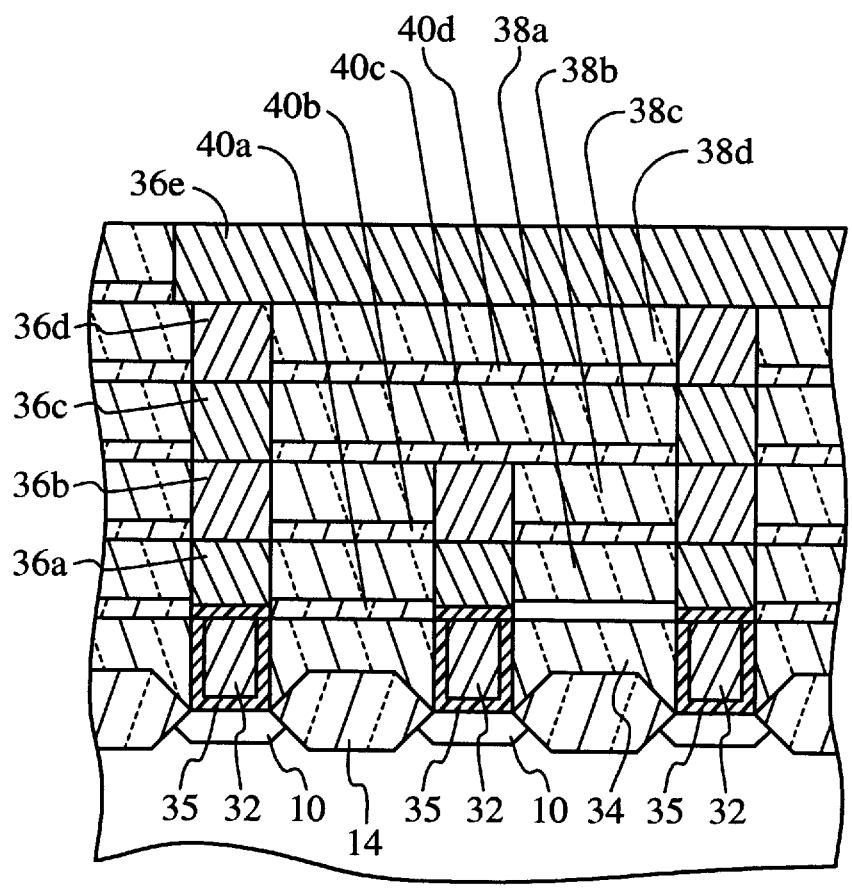
FIG. 4 is a portion of FIG. 2, showing the details of metal layers forming the multilayer interconnect structure.

A layer of metal (not shown), in this case, tungsten, is blanket-deposited. If the layer of metal blanket-deposited is tungsten, as is the case here, use of a barrier layer 35 (FIG. 4) comprising TiN or a Ti/TiN stack is not optional but rather is needed since tungsten does not stick to oxide. If the layer of metal blanket-deposited is aluminum, the barrier layer 35 is needed to enhance the aluminum fill. The metal is polished or etched down to the first silicon oxide layer 34 forming the first patterned metal layer 32. The goal is to achieve a planar surface on the first patterned metal layer 32 which is flush with the surrounding first silicon oxide layer 34.

Silicon nitride etch stop layer 40a is deposited on the planar surface followed by the deposition of additional silicon oxide layer 38a. Silicon oxy-nitride, aluminum oxide, or boron nitride as well as other nitrides or oxynitrides can also be used as an etch stop, but silicon nitride is preferred. This etch stop layer 40a, however, is optional. Additional silicon oxide layer 38a and silicon nitride etch stop layer 40a are patterned and etched. A layer of metal (not shown), in this case, aluminum, is blanket-deposited. The layer of metal may be formed on a barrier layer (not shown) comprising TiN or a Ti/TiN stack. As discussed above, if the layer of metal blanket-deposited is aluminum, as is the case here, a barrier layer is needed to enhance the aluminum fill. The metal is polished or etched down to the additional silicon oxide layer 38a forming the additional patterned metal layer 36a. As before, the goal is to achieve a planar surface on the additional patterned metal layer 36a which is flush with the surrounding additional silicon oxide layer 38a.

The identical process is repeated to form additional patterned metal layers 36b–e and the corresponding dielectrics used for isolation, i.e., additional silicon oxide layers 38b–e and the silicon nitride etch stop layers 40b–e.

In this case, each patterned metal layer, (i.e., the first patterned metal layer 32 as well as the additional patterned metal layers 36) and the surrounding dielectric used for isolation, (which in this case comprises the additional silicon oxide layer 38 plus the silicon nitride etch stop layer 40) has the same thickness. In particular, the target metal/isolation thickness is 0.7 $\mu$m. In practice, identical thickness is not necessary. At higher levels the patterned metal layers may be thicker.

Also, in this case, each additional patterned metal layer 36 is formed by the same process. No specific process module is needed for contact layers. Accordingly, the manufacturing process is simplified thus resulting in lower cost.

Nevertheless, any number of additional levels comprising additional patterned metal layers 36, and the corresponding dielectric used for isolation, can be formed by repeating a portion of the steps outlined above. In particular, the steps required to form additional patterned metal layers and the corresponding dielectric used for isolation involve depositing, patterning, and etching the silicon nitride etch stop layer 40 (optional) and additional silicon oxide layer 38, blanket-depositing a layer of metal, preferably aluminum, and polishing or etching the metal down to the additional silicon oxide layer 38 to form the additional patterned metal layer 36. With the novel metallization scheme of the present invention, the processing is truly modular, i.e., processing steps will be essentially the same from one level of metallization to another.

In the preferred embodiment of the present invention, a damascene metallization process using an etch stop is employed and polishing is used as a means for removing the layer of metal blanket-deposited onto the oxide. Accordingly, no aluminum plasma etch is required.

Preferred dielectrics for isolation include silicon oxide, with silicon nitride used as an etch stop. Other oxides and nitrides may be used as well. Oxides are usable regardless of the deposition technique. Nitride and silicon oxy-nitride are less useful, as the dielectric constant of these dielectrics is high. Xerogels consist mainly of porous silicon oxide. Xerogels are favored because of their low dielectric constant and because they can be etched or polished well. Xerogels may be used instead of crystalline oxide and boron nitride may be used instead of nitride.

Tungsten and aluminum are preferred for use in forming the first patterned metal layer 32 and the additional patterned metal layers 36, respectively. The additional patterned metal layers 36, however, may comprise aluminum alloys or copper. Copper is difficult to etch, but easy to polish.

As discussed above, barrier layers comprising barrier metals such as Ti and TiN may be used in the process of the present invention. If the layer of metal to be blanket-deposited is aluminum, a barrier layer is needed to enhance the aluminum fill in the formation of the patterned metal layers. Resistance to electromigration, however, may be better when no barrier metals are employed. As such, the use of a barrier metal may not be preferred.

It will be appreciated that many variations of films and materials are possible.

The multilayer interconnect structure of the present invention may also be constructed by employing an alternative process. In another embodiment of the process of the present invention, the multilayer interconnect structure is formed by depositing a layer of metal, patterning and etching the layer of metal to form at least one opening therein, blanket-depositing a layer of dielectric over the layer of metal filling the opening, polishing or etching the layer of dielectric at least down to the layer of metal to remove the dielectric outside the opening, thereby forming a patterned metal layer embedded in the dielectric. This process can be repeated at least once to form multiple layers of patterned metal interconnects. As such, the process is truly modular since the processing steps will be essentially the same from one level to another.

In accordance with the invention, the use of patterned metal layers which may be formed from the same process modules and which may have essentially the same thickness for each level, makes both design and construction of multilayer interconnects simpler. As discussed above, identical thickness is not necessary. At higher levels the patterned metal layers may be thicker.

The multilayer interconnect structure shown in FIG. 3 demonstrates the design flexibility enabled by the interconnect layout method of the present invention. Although the thickness of each patterned metal layer shown in FIG. 3 is essentially the same, the width and length (not shown) vary. In particular, assuming the limits of current manufacturing technology, the width may range from a minimum of 0.375 $\mu$m to a maximum of 4 $\mu$m, while the minimum spacing is 0.375 $\mu$m.

Accordingly, the aspect ratio of the patterned metal layers, i.e., the ratio of height to width, will be less than 2. In contrast, as device geometry gets smaller ($\leq$0.35 $\mu$m) contact/via aspect ratios (the ratio of height to diameter) and hence the aspect ratio of the tungsten plugs becomes higher (close to 2.0 or higher). The difficulties associated with the manufacture of metal plugs in contact/vias with high aspect ratio are well-known.

The width and length of the patterned metal layers may be varied by the designer. Varying the width and length of the patterned metal layers enables interconnect lines as well as contacts to be created and allows the designer freedom to assemble various structures. With the process of the present invention, both interconnect lines which form electrical connections along horizontal paths, as well as contacts which form electrical connections along vertical paths, can be formed using patterned metal interconnects as building-blocks.

To form thicker metal layers for the purpose of constructing contacts (i.e., metal plugs) or thick interconnect lines, two or more patterned metal layers may be stacked on each other. For instance, vertical low ohmic bussing is made possible with a vertical power bus 42 (shown in the upper left corner of FIG. 3) which is formed from four patterned metal layers (additional patterned metal layers 36b–e). For the first patterned metal layer 32 comprising tungsten, the resistivity is about 0.2 $\Omega/\square$, while for the additional patterned metal layers 36 comprising aluminum, the resistivity is about 0.05 $\Omega/\square$. Thicker metal layers can be formed by assembling patterned metal layers thus increasing conductance.

Isolation (both horizontal and vertical isolation) between patterned metal layers is provided by the dielectric surrounding the patterned metal layers. An example of vertical isolation is shown in region 44 of FIG. 3. Here, an interconnect formed from the first patterned metal layer 32 and an interconnect formed from additional patterned metal layer 36b are isolated by not forming a patterned metal layer between the two interconnects. In place of metal, the oxide and nitride of additional silicon oxide layer 38a and silicon nitride etch stop layer 40a serve to isolate the two interconnects in this region.

The process of the invention, also enables borderless contacts to be formed between patterned metal layers of separate levels. The width and/or length of the patterned metal layers can be matched such that there is no overlapping metal when contact is formed therebetween.

Additionally, the process of the present invention is compatible with existing tooling in the factory wherein new hardware is not required, translating to low-cost as well as highly manufacturable technology. The process of the present invention is fully compatible with steppers using global alignment which is particularly well suited to use of the oxide and nitrides which are transparent and have minimal reflectance. Conventional layout tools, (e.g., design rule checkers and extraction tools, etc.) can be used for design. Further, the process of the present invention will be compatible with shrinking older designs.

Finally, because all layers are planar, lithography is easier.

The multilayer interconnect structure of the present invention may be constructed by employing yet another alternative process which closely resembles the conventional process for forming multilayer interconnect structures, however, many of the above-listed process advantages are not applicable to this process. In this alternative embodiment, the multilayer interconnect structure is formed using the conventional process for forming multilayer interconnect structures such as shown in FIG. 1 except that the first metal plugs 18 as well as the second metal plugs 26, both comprising tungsten, are each replaced by a patterned metal layer which may simultaneously form (1) electrical connection along paths parallel to the substrate as well as (2) electrical connection along paths perpendicular to the substrate. Accordingly, tungsten metallization, which is conventionally employed in the formation of tungsten plugs at the contact/via level, instead is used as patterned metallization for interconnection (i.e., wiring) on this level. In this process, the multilayer interconnect structure is formed by depositing a first metal layer, patterning and etching the first metal layer to form at least one opening therein, blanket-depositing a layer of dielectric over the first metal layer filling the opening therein, patterning and etching at least one opening in the dielectric layer down to the first metal layer, forming a second metal layer over the layer of dielectric filling the opening therein, polishing or etching the second metal layer at least down to the layer of dielectric to remove metal outside the opening in the layer of dielectric. The opening and/or openings in the layer of dielectric, filled with the second metal layer, may form electrical connection along paths parallel to the substrate and/or electrical connection along paths perpendicular to the substrate. This process can be repeated to form additional layers of patterned metal interconnects. As discussed above, many of the above-mentioned process advantages are foregone, nevertheless, it is possible to construct the multilayer interconnect structure of the present invention using this process as well.

INDUSTRIAL APPLICABILITY

The process of the invention for forming multilayer interconnects is expected to find use in the fabrication of silicon-based devices and devices comprising compound semiconductors and may be applied to MOS and bipolar technologies.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Many variations of films and materials are possible. It is possible that the invention may be practiced in other fabrication technologies in MOS or bipolar processes. It is also possible that the invention may be practiced in other fabrication technologies used for compound semiconductors. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A multilayer interconnect structure for connecting conductive regions to conductive regions separated by insulating regions supported on a semiconductor substrate, said semiconductor substrate containing conducting regions therein which are electrically contacted by portions of said multilayer interconnect structure, said multilayer interconnect structure further comprising a plurality of planar structures stacked one on top of another over said semiconductor substrate, each planar structure having a top surface and a bottom surface and having at least one adjacent planar structure contacting said top surface, said bottom surface, or both, and each planar structure comprising a patterned metal layer comprising either a single conductor layer or said conductor layer and a substantially thinner barrier layer, said single conductor layer comprising metal selected from the group consisting of aluminum, aluminum alloy, tungsten, and copper, said single conductor layer in some of said plurality of planar structures comprising tungsten and said single conductor layer in others of said plurality of planar structures comprising aluminum, said patterned metal layer having a thickness, said patterned metal layer embedded in a dielectric, thereby forming metal regions and dielectric regions, said patterned metal layer exposed at both said top surface and said bottom surface of said planar structures, thereby enabling electrical contact to be formed between selected metal regions in said adjacent planar structures so as to form electrical connections along paths perpendicular to said semiconductor substrate and electrical connection on paths parallel to said semiconductor substrate, wherein each said planar structure simultaneously forms electrical connection along paths perpendicular to said semiconductor substrate and electrical connections along paths parallel to said semiconductor substrate and wherein said thickness across each of said patterned metal layers in each of said planar structures is essentially the same.

2. The multilayer interconnect structure of claim 1 wherein said plurality of planar structures are formed on an initial patterned metal layer contacting at least one of said conducting regions in said semiconductor substrate, said initial patterned metal layer embedded in said insulating regions plus an initial layer of said dielectric, at least one of said metal regions in said plurality of planar structures forming electrical contact with said initial patterned metal layer.

3. The multilayer interconnect structure of claim 1 wherein said substantially thinner barrier layer comprises a refractory metal.

4. The multilayer interconnect structure of claim 1 wherein the cross-section of each of said metal regions has a ratio of height to width not greater than 2.

5. The multilayer interconnect structure of claim 1 wherein said dielectric is selected from the group consisting of oxides, nitrides, and oxy-nitrides.

6. The multilayer interconnect structure of claim 5 wherein said dielectric is selected from the group consisting of silicon oxide, silicon nitride, silicon oxy-nitride, aluminum oxide, and boron nitride.

7. The multilayer interconnect structure of claim 1 further comprising an etch stop layer beneath at least one of said layers of said dielectric.

8. A multilayer interconnect structure for connecting conductive regions to conductive regions separated by insulating regions supported on a semiconductor substrate, said semiconductor substrate containing conducting regions therein which are electrically contacted by portions of said multilayer interconnect structure, said multilayer interconnect structure further comprising a plurality of planar structures stacked one on top of another over said semiconductor substrate, each planar structure having a top surface and a bottom surface and having at least one adjacent planar structure contacting said top surface, said bottom surface, or both, and each planar structure comprising a patterned metal layer comprising either a single conductor layer or said conductor layer and a substantially thinner barrier layer, said single conductor layer comprising metal selected from the group consisting of aluminum, aluminum alloy, tungsten, and copper, said single conductor layer in some of said plurality of planar structures comprising tungsten and said single conductor layer in others of said plurality of planar structures comprising aluminum, said patterned metal layer having a thickness, said patterned metal layer embedded in a dielectric, thereby forming metal regions and dielectric regions, said dielectric layer formed on top of an etch stop layer, said patterned metal layer exposed at both said top surface and said bottom surface of said planar structures, thereby enabling electrical contact to be formed between selected metal regions in said adjacent planar structures so as to form electrical connections along paths perpendicular to said semiconductor substrate and electrical connection on paths parallel to said semiconductor substrate, wherein each said planar structure simultaneously forms electrical connection along paths perpendicular to said semiconductor substrate and electrical connections along paths parallel to said semiconductor substrate and wherein said thickness across each of said patterned metal layers in each of said planar structures is essentially the same.

9. The multilayer interconnect structure of claim 8 wherein said plurality of planar structures are formed on an initial patterned metal layer contacting at least one of said conducting regions in said semiconductor substrate, said initial patterned metal layer embedded in said insulating regions plus an initial layer of said dielectric, at least one of said metal regions in said plurality of planar structures forming electrical contact with said initial patterned metal layer.

10. The multilayer interconnect structure of claim 8 wherein said substantially thinner barrier layer comprises a refractory metal.

11. The multilayer interconnect structure of claim 8 wherein each said planar structures simultaneously forms electrical connection along paths perpendicular to said semiconductor substrate and electrical connection along paths parallel to said semiconductor substrate.

12. The multilayer interconnect structure of claim 8 wherein the cross-section of each of said metal regions has a ratio of height to width not greater than about 2.

13. The multilayer interconnect structure of claim 8 wherein said dielectric is selected from the group consisting of oxides, nitrides, and oxy-nitrides.

14. The multilayer interconnect structure of claim 13 wherein said dielectric is selected from the group consisting of silicon oxide, silicon nitride, silicon oxy-nitride, aluminum oxide, and boron nitride.

15. A multilayer interconnect structure for connecting conductive regions to conductive regions separated by insulating regions supported on a semiconductor substrate, said semiconductor substrate containing conducting regions therein which are electrically contacted by portions of said multilayer interconnect structure, said multilayer interconnect structure comprising a plurality of planar structures stacked one on top of another over said semiconductor substrate, each planar structure having a top surface and a bottom surface and having at least one adjacent planar structure contacting said top surface, said bottom surface, or both, and each planar structure comprising a patterned metal layer comprising either a single conductor layer or said single conductor layer and a substantially thinner barrier layer, said patterned metal layer embedded in a dielectric, thereby forming metal regions and dielectric regions, said patterned metal layer exposed at both said top surface and said bottom surface of said planar structures, thereby enabling electrical contact to be formed between selected metal regions in said adjacent planar structures so as to form electrical connection along paths perpendicular to said semiconductor substrate and electrical connection on paths parallel to said semiconductor substrate, wherein some of said single conductor layers comprise tungsten and other of said single conductor layers comprise aluminum.

16. The multilayer interconnect structure of claim 15 wherein said plurality of planar structures are formed on an initial patterned metal layer contacting at least one of said conducting regions in said semiconductor substrate, said initial patterned metal layer embedded in said insulating regions plus an initial layer of said dielectric, at least one of said metal regions in said plurality of planar structures forming electrical contact with said initial patterned metal layer.

17. The multilayer interconnect structure of claim 15 wherein said substantially thinner barrier layer comprises a refractory metal.

18. The multilayer interconnect structure of claim 15 wherein each said planar structure simultaneously forms electrical connection along paths perpendicular to said semiconductor substrate and electrical connection along paths parallel to said semiconductor substrate.

19. The multilayer interconnect structure of claim 15 wherein the cross-section of each of said metal regions has a ratio of height to width not greater than 2.

20. The multilayer interconnect structure of claim 15 wherein the thickness of each of said patterned metal layers in each of said planar structures is essentially the same.

21. The multilayer interconnect structure of claim 15 wherein said single conductor layer comprises metal selected from the group consisting essentially of aluminum, aluminum alloy, tungsten, and copper.

22. The multilayer interconnect structure of claim 15 wherein said dielectric is selected from the group consisting of oxides, nitrides, and oxy-nitrides.

23. The multilayer interconnect structure of claim 22 wherein said dielectric is selected from the group consisting of silicon oxide, silicon nitride, silicon oxy-nitride, aluminum oxide, and boron nitride.

24. The multilayer interconnect structure of claim 15 further comprising an etch stop layer beneath at least one of said layers of said dielectric.

25. A multilayer interconnect structure for connecting conductive regions to conductive regions separated by insulating regions supported on a semiconductor substrate, said semiconductor substrate containing conducting regions therein that are electrically contacted by portions of said multilayer interconnect structure, said multilayer interconnect structure comprising a plurality of planar structures stacked one on top of another over said semiconductor substrate, each planar structure having a top surface and a bottom surface and having at least one adjacent planar structure contacting said top surface, said bottom surface, or both, and each planar structure comprising a patterned metal layer comprising either a single conductor layer or said single conductor layer and a substantially thinner barrier layer, said patterned metal layer embedded in a dielectric, thereby forming metal regions and dill electric regions, said dielectric formed on top of an etch stop layer, said patterned metal layer exposed at both said top surface and said bottom surface of said planar structures, thereby enabling electrical contact to be formed between selected metal regions in said adjacent planar structures so as to form electrical connection along paths perpendicular to said semiconductor substrate and electrical connection on paths parallel to said semiconductor substrate, wherein some of said single conductor layers comprise tungsten and other of said single conductor layers comprise aluminum.

26. The multilayer interconnect structure of claim 25 wherein said plurality of planar structures are formed on an initial patterned metal layer contacting at least one of said conducting regions in said semiconductor substrate, said initial patterned metal layer embedded in said insulating regions plus an initial layer of said dielectric, at least one of said metal regions in said plurality of planar structures forming electrical contact with said initial patterned metal layer.

27. The multilayer interconnect structure of claim 25 wherein said substantially thinner barrier layer comprises a refractory metal.

28. The multilayer interconnect structure of claim 25 wherein each of said planar structures simultaneously forms electrical connection along paths perpendicular to said semiconductor substrate and electrical connection along paths parallel to said semiconductor substrate.

29. The multilayer interconnect structure of claim 25 wherein the cross-section of each of said metal regions has a ratio of height to width not greater than 2.

30. The multilayer interconnect structure of claim 25 wherein the thickness of each of said patterned metal layers in each of said planar structures is essentially the same.

31. The multilayer interconnect structure of claim 25 wherein said single conductor layer comprises metal selected from the group consisting essentially of aluminum, aluminum alloy, tungsten, and copper.

32. The multilayer interconnect structure of claim 25 wherein said dielectric is selected from the group consisting of oxides, nitrides, and oxy-nitrides.

33. The multilayer interconnect structure of claim 32 wherein said dielectric is selected from the group consisting of silicon oxide, silicon nitride, silicon oxy-nitride, aluminum oxide, and boron nitride.

* * * * *